(12) United States Patent
Goto et al.

(10) Patent No.: US 12,109,580 B2
(45) Date of Patent: Oct. 8, 2024

(54) PROCESSING LIQUID NOZZLE AND CLEANING APPARATUS

(71) Applicant: Tokyo Electron Limited, Tokyo (JP)

(72) Inventors: Daisuke Goto, Kumamoto (JP); Katsuhiro Morikawa, Kumamoto (JP); Takahiro Koga, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 308 days.

(21) Appl. No.: 17/763,371

(22) PCT Filed: Sep. 14, 2020

(86) PCT No.: PCT/JP2020/034618
§ 371 (c)(1),
(2) Date: Mar. 24, 2022

(87) PCT Pub. No.: WO2021/060036
PCT Pub. Date: Apr. 1, 2021

(65) Prior Publication Data
US 2022/0371041 A1    Nov. 24, 2022

(30) Foreign Application Priority Data

Sep. 25, 2019   (JP) ................................. 2019-174136

(51) Int. Cl.
*B05B 17/06*       (2006.01)
*B08B 3/02*        (2006.01)
(Continued)

(52) U.S. Cl.
CPC .......... *B05B 17/0676* (2013.01); *B08B 3/022* (2013.01); *B08B 3/08* (2013.01);
(Continued)

(58) Field of Classification Search
None
See application file for complete search history.

(56) References Cited

U.S. PATENT DOCUMENTS

2007/0181163 A1*  8/2007  Wada .................. H01L 21/0206
                                                        134/2
2009/0114253 A1*  5/2009  Matsumoto ......... H01L 21/6708
                                                        134/30

FOREIGN PATENT DOCUMENTS

JP    H02-257632 A    10/1990
JP    2001-096243 A    4/2001
(Continued)

OTHER PUBLICATIONS

JP 2001096243 A transation, Hayamizu, Ultrasonic Nozzle Unit and Device and Method for Treating With Ultrasonic Wave Using the Same (Year: 2001).*

(Continued)

*Primary Examiner* — Cristi J Tate-Sims
(74) *Attorney, Agent, or Firm* — Venjuris, P.C.

(57) ABSTRACT

A processing liquid nozzle includes: an ultrasonic wave generator including a oscillator that generates ultrasonic waves and a oscillating body that is joined to the oscillator; a first supply flow path configured to supply a first liquid to a position in contact with the oscillating body of the ultrasonic wave generator; an ejection flow path configured to supply the first liquid to which the ultrasonic waves are applied by the ultrasonic wave generator to an ejection port; and a second supply flow path connected to the ejection flow path on a downstream side from the ultrasonic wave generator and configured to supply a second liquid to the ejection flow path.

17 Claims, 7 Drawing Sheets

(51) Int. Cl.
*B08B 3/08* (2006.01)
*B08B 3/12* (2006.01)
*B08B 5/02* (2006.01)
*B08B 5/04* (2006.01)
*B08B 13/00* (2006.01)

(52) U.S. Cl.
CPC ............... *B08B 3/123* (2013.01); *B08B 5/02* (2013.01); *B08B 5/04* (2013.01); *B08B 13/00* (2013.01); *B08B 2203/0217* (2013.01); *B08B 2203/0288* (2013.01)

(56) References Cited

FOREIGN PATENT DOCUMENTS

| | | |
|---|---|---|
| JP | 2003-100688 A | 4/2003 |
| JP | 2007-214347 A | 8/2007 |
| JP | 2009-200331 A | 9/2009 |
| JP | 2017-069403 A | 4/2017 |
| JP | 2017-073467 A | 4/2017 |
| JP | 2017-183553 A | 10/2017 |
| WO | 2007/132609 A1 | 11/2007 |

OTHER PUBLICATIONS

JP 2003100688 A translation, Asano, Substrate Treating Device (Year: 2003).*
JP 2017069403 A translation, Shinohara, Substrate Liquid Processing Apparatus, Substrate Liquid Processing Method (Year: 2017).*
Piranha Solutions, https://ehs.princeton.edu/book/export/html/513#:~:text=The%20solution%20may%20be%20mixed,not%20handled%20with%20extreme%20caution. (Year: 2019).*
International Search Report issued on Nov. 24, 2020 for WO 2021/060036 A1 (6 pages).

* cited by examiner

PROCESSING LIQUID NOZZLE AND CLEANING APPARATUS

CROSS REFERENCE TO RELATED APPLICATIONS

This application is a national phase of PCT application No. PCT/JP2020/034618, filed on 14 Sep. 2020, which claims priority from Japanese patent application No. 2019-174136, filed on 25 Sep. 2019, all of which are incorporated herein by reference.

TECHNICAL FIELD

Embodiments disclosed relate to a processing liquid nozzle and a cleaning apparatus.

BACKGROUND

In the related art, a technology that cleans a surface of a substrate such as a semiconductor wafer (hereinafter, also referred to as a "wafer") with a cleaning liquid, applied with ultrasonic waves and ejected from a processing liquid nozzle, is known (see Patent Document 1).

PRIOR ART DOCUMENT

Patent Document

Patent Document 1: Japanese Patent Laid-Open Publication No. 2009-200331

DISCLOSURE OF THE INVENTION

Problems to be Solved

The present disclosure provides a technology capable of suppressing an oscillating body that applies ultrasonic waves to a cleaning liquid in a processing liquid nozzle from being damaged.

Means to Solve the Problem

A processing liquid nozzle according to an aspect of the present disclosure includes an ultrasonic wave generator, a first supply flow path, an ejection flow path, and a second supply flow path. The ultrasonic wave generator includes an oscillator that generates ultrasonic waves and an oscillating body that is connected to the oscillator. The first supply flow path supplies a first liquid to a position that is in contact with the oscillating body of the ultrasonic wave generator. The ejection flow path supplies the first liquid to which the ultrasonic waves are applied by the ultrasonic wave generator to an ejection port. The second supply flow path is connected to the ejection flow path on a downstream side from the ultrasonic wave generator and supplies a second liquid to the ejection flow path.

Effect of the Invention

According to the present disclosure, it is possible to suppress an oscillating body that applies ultrasonic waves to a cleaning liquid in a processing liquid nozzle from being damaged.

DETAILED DESCRIPTION TO EXECUTE THE INVENTION

Hereinafter, embodiments of a processing liquid nozzle and a cleaning apparatus disclosed herein will be described in detail with reference to the accompanying drawings. Further, the present disclosure is not limited to the following exemplary embodiments. Further, the drawings are schematic, and the relationship between dimensions of each element, the ratio of each element, or the like may differ from the actual situation. Portions having different dimensional relationships and ratios from each other may be included between drawings.

In the related art, a technology that cleans a surface of a substrate such as a semiconductor wafer (hereinafter, also referred to as a "wafer") with a cleaning liquid applied with ultrasonic waves and ejected from a processing liquid nozzle, is known. Meanwhile, when an effervescent liquid is used as the cleaning liquid, the bubbles in the liquid are burst by the applied ultrasonic waves, and thus, the oscillating body that applies the ultrasonic waves may be damaged by the impact force when the bubbles are burst.

Therefore, it is expected to realize a technology capable of overcoming the above-described problems and suppressing an oscillating body that applies ultrasonic waves to a cleaning liquid in a processing liquid nozzle from being damaged.

[Outline of Substrate Processing System]

Figure 1:
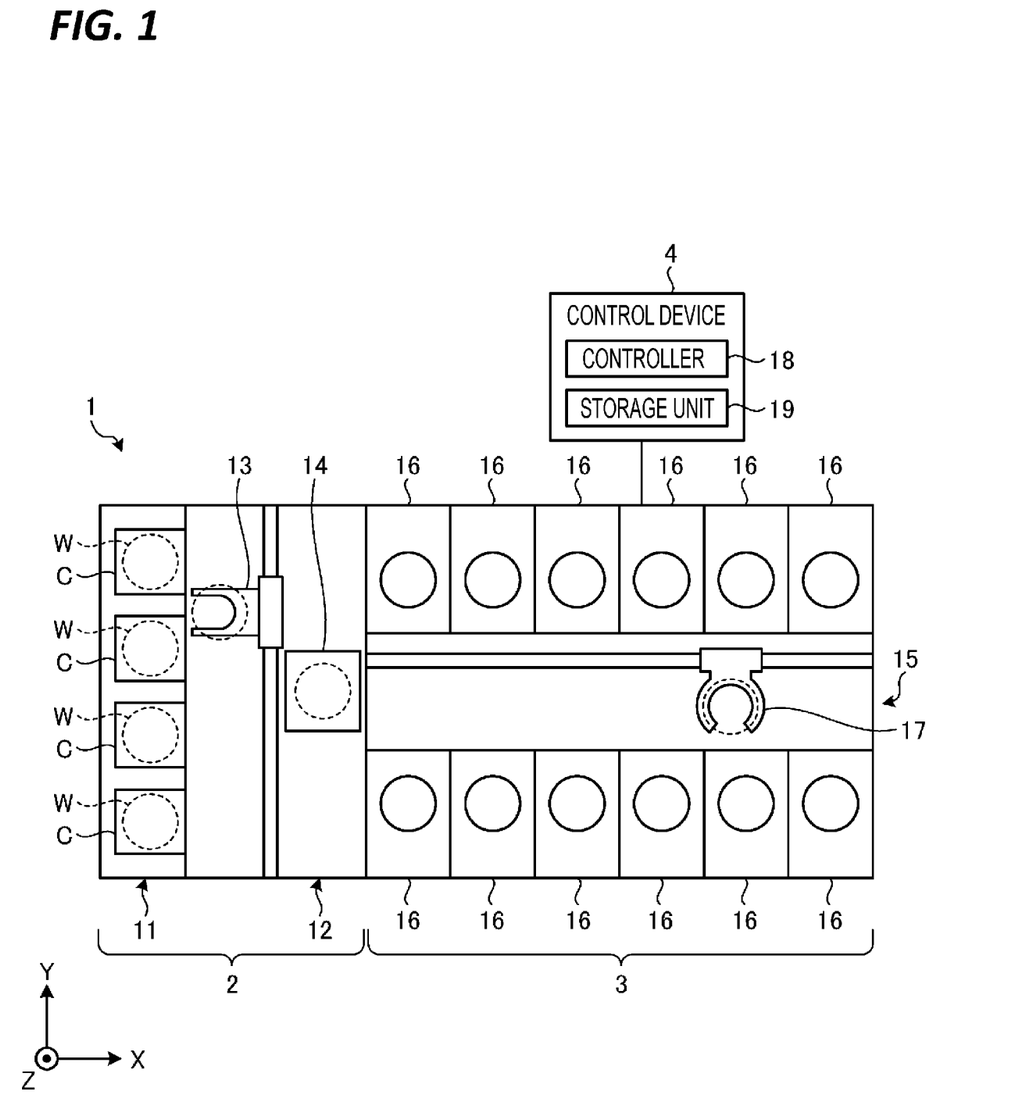
FIG. 1 is a schematic view illustrating a schematic configuration of a substrate processing system according to an embodiment.

First of all, a schematic configuration of a substrate processing system 1 according to an embodiment will be described with reference to FIG. 1. FIG. 1 is a view illustrating a schematic configuration of the substrate processing system 1 according to the embodiment. The substrate processing system 1 is an example of a cleaning apparatus. In the following, in order to clarify positional relationships, the X-axis, Y-axis, and Z-axis are defined as being orthogonal to each other. The positive Z-axis direction is regarded as a vertically upward direction.

As illustrated in FIG. 1, the substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates, that is, semiconductor wafers W (hereinafter, referred to as "wafers W") in the embodiment, in a horizontal state.

The transfer section 12 is provided adjacent to the carrier placing section 11, and provided with a substrate transfer device 13 and a delivery unit 14 therein. The substrate transfer device 13 is provided with a wafer holding mechanism that holds the wafers W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 are arranged at both sides of the transfer section 15.

The transfer section 15 is provided with a substrate transfer device 17 therein. The substrate transfer device 17 is provided with a wafer holding mechanism that holds the wafer W. Further, the substrate transfer device 17 is movable horizontally and vertically and pivotable around a vertical axis, and transfers the wafers W between the delivery unit 14 and the processing units 16 by using the wafer holding mechanism.

Each processing unit 16 performs a predetermined substrate processing on the wafers W transferred by the substrate transfer device 17.

Further, the substrate processing system 1 is provided with a control device 4. The control device 4 is, for example, a computer, and includes a controller 18 and a storage unit 19. The storage unit 19 stores a program that controls various processings performed in the substrate processing system 1. The controller 18 controls the operations of the substrate processing system 1 by reading and executing the program stored in the storage unit 19.

The program may be recorded in a computer-readable recording medium, and installed from the recording medium to the storage unit 19 of the control device 4. The computer-readable recording medium may be, for example, a hard disk (HD), a flexible disk (FD), a compact disk (CD), a magnet optical disk (MO), or a memory card.

In the substrate processing system 1 configured as described above, the substrate transfer device 13 of the carry-in/out station 2 first takes out a wafer W from a carrier C placed in the carrier placing section 11, and then, places the taken wafer W on the delivery unit 14. The wafer W placed on the delivery unit 14 is taken out from the delivery unit 14 by the substrate transfer device 17 of the processing station 3, and carried into a processing unit 16.

The wafer W carried into the processing unit 16 is processed by the processing unit 16, and then, carried out from the processing unit 16 and placed on the delivery unit 14 by the substrate transfer device 17. Then, the processed wafer W placed on the delivery unit 14 is returned to the carrier C of the carrier placing section 11 by the substrate transfer device 13.

[Configuration of Processing Unit]

Figure 2:
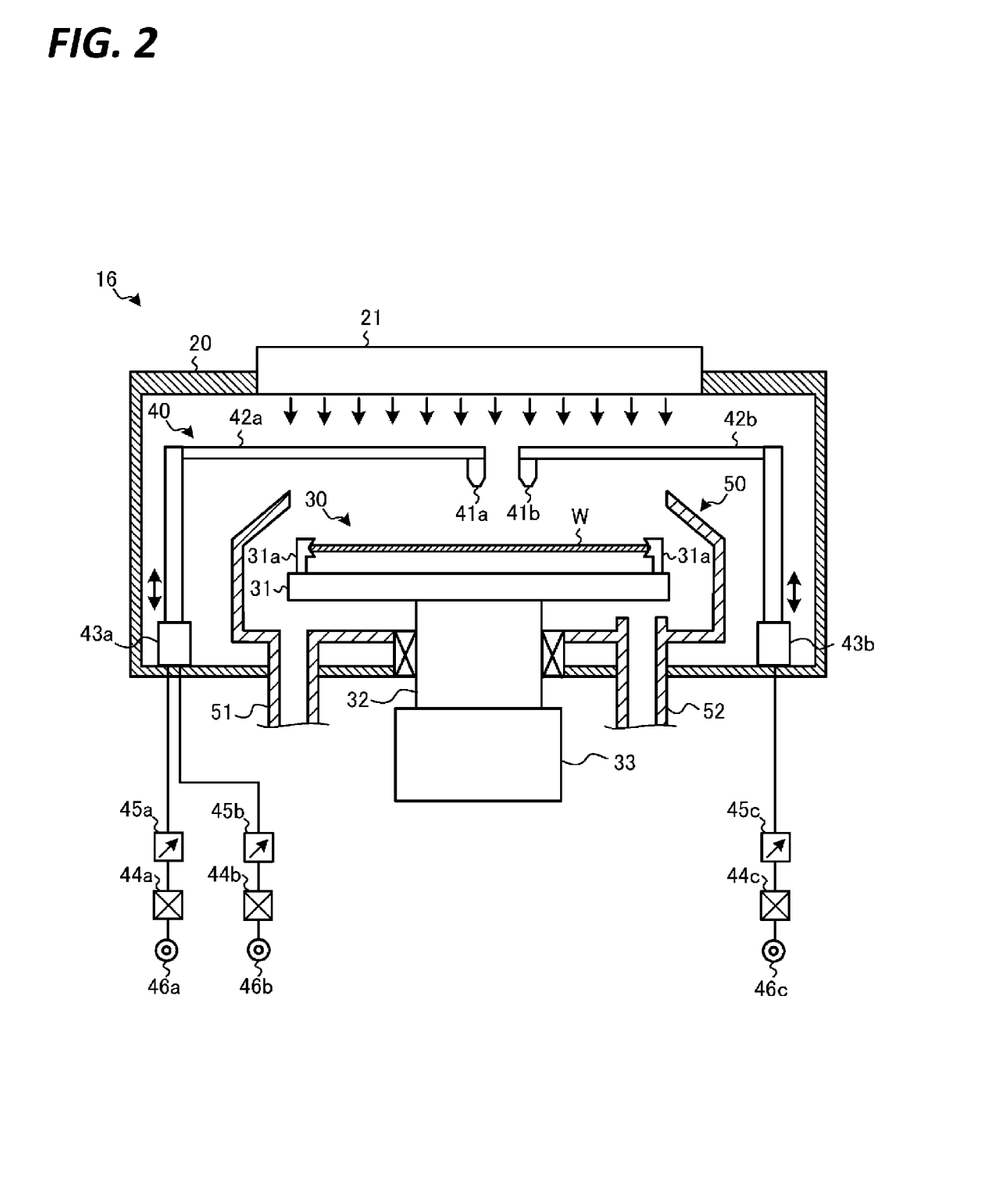
FIG. 2 is a schematic view illustrating a specific example of a configuration of a processing unit.

Next, a configuration of the processing unit 16 will be described with reference to FIG. 2. FIG. 2 is a schematic view illustrating an example of the configuration of the processing unit 16 according to the embodiment. As illustrated in FIG. 2, the processing unit 16 is provided with a chamber 20, a substrate processing unit 30, a liquid supply 40, and a recovery cup 50.

The chamber 20 accommodates the substrate processing unit 30, the liquid supply 40, and the recovery cup 50. A fan filter unit (FFU) 21 is provided on the ceiling of the chamber 20. The FFU 21 forms a downflow in the chamber 20.

The substrate processing unit 30 is provided with a holder 31, a column 32, and a driver 33, and performs a liquid processing on the placed wafer W. The holder 31 holds the wafer W horizontally. The column 32 is a vertically extending member, is rotatably supported at the base end portion thereof by the driver 33, and supports the holder 31 horizontally at the tip end portion thereof. The driver 33 rotates the column 32 around the vertical axis.

The substrate processing unit 30 rotates the column 32 by using the driver 33, so that the holder 31 supported by the column 32 is rotated, and thus, the wafer W held in the holder 31 is rotated.

A holding member 31a is provided on the upper surface of the holder 31 provided in the substrate processing unit 30 to hold the wafer W from the lateral side. The wafer W is held horizontally by the holding member 31a in a state of being slightly separated from the upper surface of the holder 31. The wafer W is held by the holder 31 in a state where the surface on which the substrate processing is performed faces upward.

The liquid supply 40 supplies a processing fluid onto the wafer W. The liquid supply 40 includes a plurality of (here, two) nozzles 41a and 41b, arms 42a and 42b that horizontally support the nozzles 41a and 41b, respectively, and pivoting and lifting mechanisms 43a and 43b that pivot and lift the arms 42a and 42b, respectively. The nozzle 41a is an example of a processing liquid nozzle.

The nozzle 41a is connected to a first liquid supply 46a via a valve 44a and a flow rate regulator 45a, and is connected to a second liquid supply 46b via a valve 44b and a flow rate regulator 45b.

A first liquid L1 supplied from the first liquid supply 46a (see FIG. 3) is a chemical liquid having a strong acidity or a strong alkalinity, and is, for example, concentrated sulfuric acid or ammonia. A second liquid L2 supplied from the second liquid supply 46b (see FIG. 3) is a chemical liquid having an effervescent property, and is, for example, hydrogen peroxide solution or deionized water (DIW).

In the present disclosure, "the second liquid L2 has an effervescent property" is not limited to a case where the second liquid L2 foams by itself, but also includes a case where the second liquid L2 foams for the first time when mixed with another liquid (e.g., the first liquid L1).

The nozzle 41b is connected to a DIW supply source 46c through a valve 44c and a flow rate regulator 45c. DIW is used for, for example, a rinse processing. The processing liquid used for the rinse processing is not limited to DIW.

A mixed liquid M (see FIG. 3) in which the first liquid L1 supplied from the first liquid supply 46a and the second liquid L2 supplied from the second liquid supply 46b are mixed is ejected from the nozzle 41a. Details of the nozzle 41a will be described later. From the nozzle 41b, the DIW supplied from the DIW supply source 46c is ejected.

The recovery cup 50 is disposed to surround the holder 31, and collects the processing liquid scattered from the wafer W by the rotation of the holder 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside of the processing unit 16.

While descriptions have been made on an example in which two nozzles are provided in the processing unit 16 of the embodiment, the number of nozzles provided in the processing unit 16 is not limited to two.

[Details of Processing Liquid Nozzle]

Figure 3:
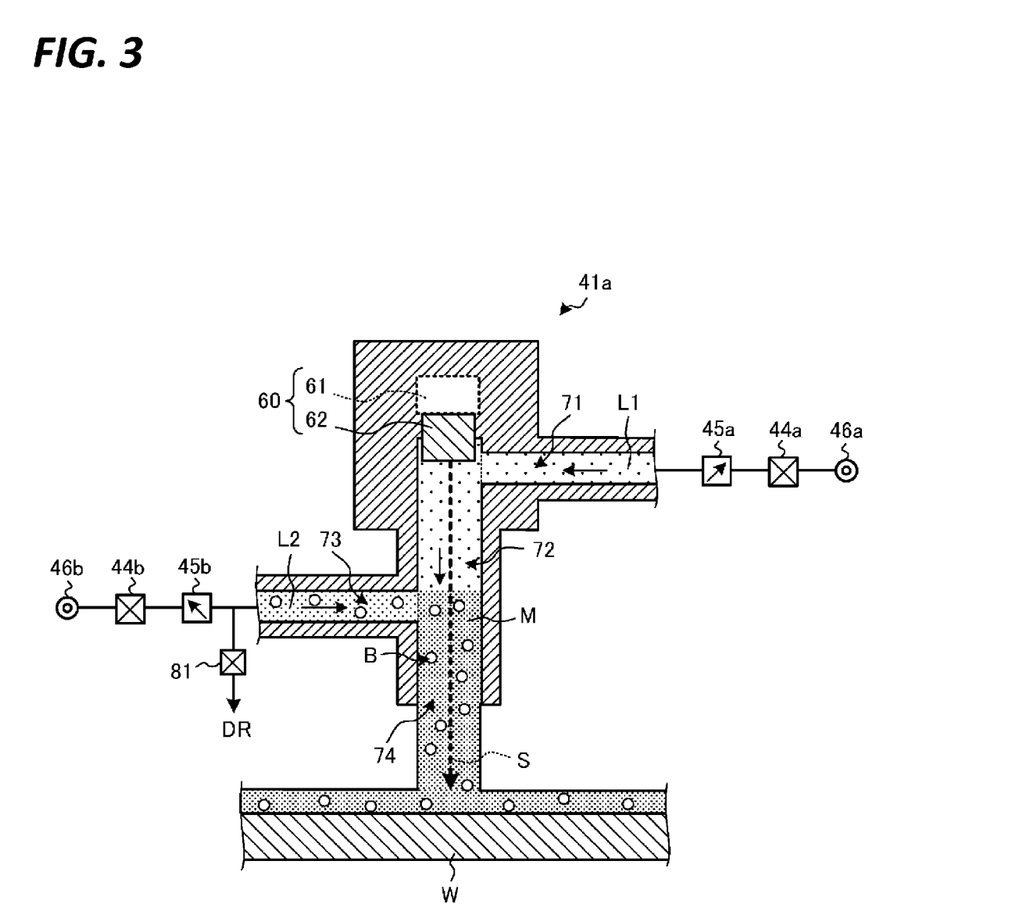
FIG. 3 is a view illustrating a configuration of a processing liquid nozzle according to the embodiment.

Next, descriptions will be made on details of the nozzle 41a, which is an example of the processing liquid nozzle according to the embodiment, with reference to FIG. 3. FIG. 3 is a view illustrating the configuration of the processing liquid nozzle according to the embodiment.

As illustrated in FIG. 3, the nozzle 41a is provided with an ultrasonic wave generator 60, a first supply flow path 71, an ejection flow path 72, and a second supply flow path 73. The nozzle 41a generates the mixed liquid M by mixing the first liquid L1 supplied from the first supply flow path 71 and the second liquid L2 supplied from the second supply flow path 73, applies ultrasonic waves S to the mixed liquid M, and ejects the mixed liquid M from an ejection port 74 to the wafer W.

Here, as illustrated in FIG. 3, the mixed liquid M ejected from the ejection port 74 is ejected to the wafer W without being interrupted, and thus, the ultrasonic waves S applied by the ultrasonic wave generator 60 are able to be transmitted to the mixed liquid M arrived onto the wafer W.

That is, when cleaning the wafer W with the mixed liquid M, the nozzle 41a according to the embodiment may clean the wafer W using the physical force of the ultrasonic wave S. Therefore, according to the embodiment, even when a film (e.g., a sacrificial film) having a high chemical stability is formed on the wafer W, the film having a high chemical stability may be removed with high cleaning capability.

Next, details of each part of the nozzle 41a will be described. The ultrasonic wave generator 60 includes an oscillator 61 and an oscillating body 62.

The oscillator 61 is made of piezoelectric ceramics such as lead zirconate titanate (PZT). A drive signal having a predetermined oscillation frequency from the outside, and thus, the oscillator 61 generates the ultrasonic waves S having such a predetermined oscillation frequency. The oscillator 61 may generate the ultrasonic waves S having a relatively high frequency, for example, 200 KHz or more.

The oscillating body 62 is firmly connected to the oscillator 61. That is, in the ultrasonic wave generator 60, the oscillating body 62 and the oscillator 61 are configured to oscillate integrally, and thus, the oscillating body 62 has a function as a load at the time of oscillation.

Therefore, according to the embodiment, by directly bringing the oscillating body 62 into contact with the first liquid L1 to apply the ultrasonic waves S, the fluctuation of impedance may be reduced as compared with a case where the oscillator 61 is directly brought into contact with the first liquid L1 to apply the ultrasonic waves S thereto.

The oscillating body 62 is made of an inorganic material having chemical resistance and heat resistance. The oscillating body 62 is made of, for example, a mineral-based material such as quartz or sapphire, or a ceramic material such as alumina, titania, silica, or silicon carbide.

The first supply flow path 71 supplies the first liquid L1 to a position that is in contact with the oscillating body 62 of the ultrasonic wave generator 60. The first supply flow path 71 is connected to the upstream side of the ejection flow path 72 in which the oscillating body 62 is provided. Then, the first supply flow path 71 supplies the first liquid L1 to the upstream side of the ejection flow path 72 via the first liquid supply 46a, the valve 44a, and the flow rate regulator 45a.

The ejection flow path 72 is formed inside the nozzle 41a so as to extend downward in a straight line. In the ejection flow path 72, the oscillating body 62 of the ultrasonic wave generator 60 is provided on the upstream side, and the ejection port 74 of the nozzle 41a is formed on the downstream side. Then, the ejection flow path 72 supplies the first liquid L1 to which the ultrasonic waves S are applied by the ultrasonic wave generator 60 or the mixed liquid M generated by using the first liquid L1 to the ejection port 74.

In the embodiment, since the ejection flow path 72 is formed in a straight line, the ultrasonic waves S applied by the ultrasonic wave generator 60 may be smoothly transmitted to the surface of the wafer W.

The second supply flow path 73 supplies the second liquid L2 to the ejection flow path 72. The second supply flow path 73 is connected to the ejection flow path 72 on the downstream side from the ultrasonic wave generator 60. Then, the second supply flow path 73 supplies the second liquid L2 to the ejection flow path 72 on the downstream side from the ultrasonic wave generator 60 via the second liquid supply 46b, the valve 44b, and the flow rate regulator 45b.

Then, by supplying the second liquid L2 from the second supply flow path 73 to the ejection flow path 72, the mixed liquid M of the first liquid L1 and the second liquid L2 is generated inside the ejection flow path 72. Then, in the embodiment, since the second liquid L2 has an effervescent property, bubbles B are contained in at least the mixed liquid M.

When hydrogen peroxide solution is used as the second liquid L2, the second liquid L2 itself has an effervescent property, and thus, as illustrated in FIG. 3, in addition to the mixed liquid M, the second liquid L2 also contains the bubbles B.

Here, in the embodiment, by connecting the second supply flow path 73 to the downstream side from the ultrasonic wave generator 60, the mixed liquid M containing the bubbles B may be generated on the downstream side from the ultrasonic wave generator 60.

That is, in the embodiment, since the mixed liquid M containing the bubbles B may be generated at a position separated from the ultrasonic wave generator 60, even when the bubbles B in the mixed liquid M are burst due to the ultrasonic waves S, the impact force generated when such bubbles B are burst may be hardly transmitted to the oscillating body 62.

Therefore, according to the embodiment, the oscillating body 62 may be suppressed from being damaged inside the nozzle 41a due to the ultrasonic waves S applied to the mixed liquid M and the bubbles B contained in the mixed liquid M.

Further, in the embodiment, since the mixed liquid M having an effervescent property is positioned on the downstream side of the ejection flow path 72, when the cleaning processing is completed and the ejection of the mixed liquid M is stopped, the amount of the mixed liquid M remaining inside the nozzle 41a may be suppressed to the minimum.

Therefore, when the foaming continues inside the mixed liquid M and the volume of the mixed liquid M expands, the expansion of the volume may be suppressed to the minimum. Therefore, according to the embodiment, the mixed liquid M may be suppressed from expanding and dripping from the ejection port 74 when the ejection of the mixed liquid M is stopped.

Further, in the embodiment, the first liquid L1 may have a strong acidity or a strong alkalinity, and the second liquid L2 may have an effervescent property. Therefore, even when a film having a high chemical stability such as a sacrificial film is formed on the wafer W, the film having a high chemical stability may be removed with high cleaning capability.

Further, in the embodiment, a static elimination unit (not illustrated) configured to statically eliminate the mixed liquid M ejected from the ejection port 74 may further be provided. Such a static elimination unit is constituted by, for example, a wiring connecting between the main body of the nozzle 41a and the ultrasonic wave generator 60, or the ground potential.

Therefore, when charging or arcing of the wafer W becomes a problem, the charging or arcing of the wafer W may be suppressed form occurring when the cleaning processing using the mixed liquid M is performed.

Further, the upstream side of the second supply flow path 73 is connected to a drain unit DR via a valve 81. The valve 81 and the drain unit DR are positioned below the second supply flow path 73. Subsequently, details of a liquid dripping suppression processing using the valve 81 will be described with reference to FIGS. 4 and 5.

Figure 4:
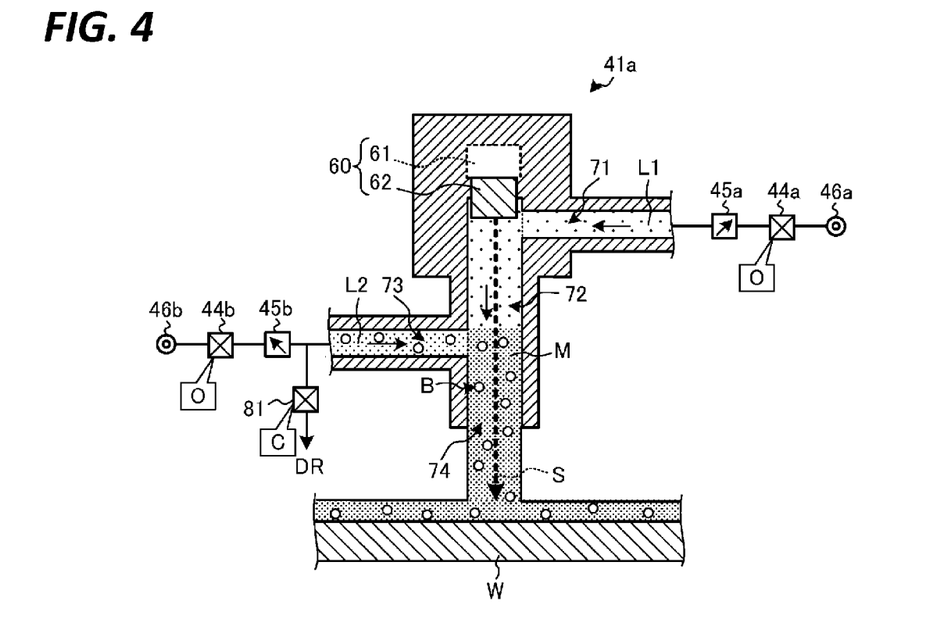
FIG. 4 is a view illustrating a liquid dripping suppression processing of the processing liquid nozzle according to the embodiment.
Figure 5:
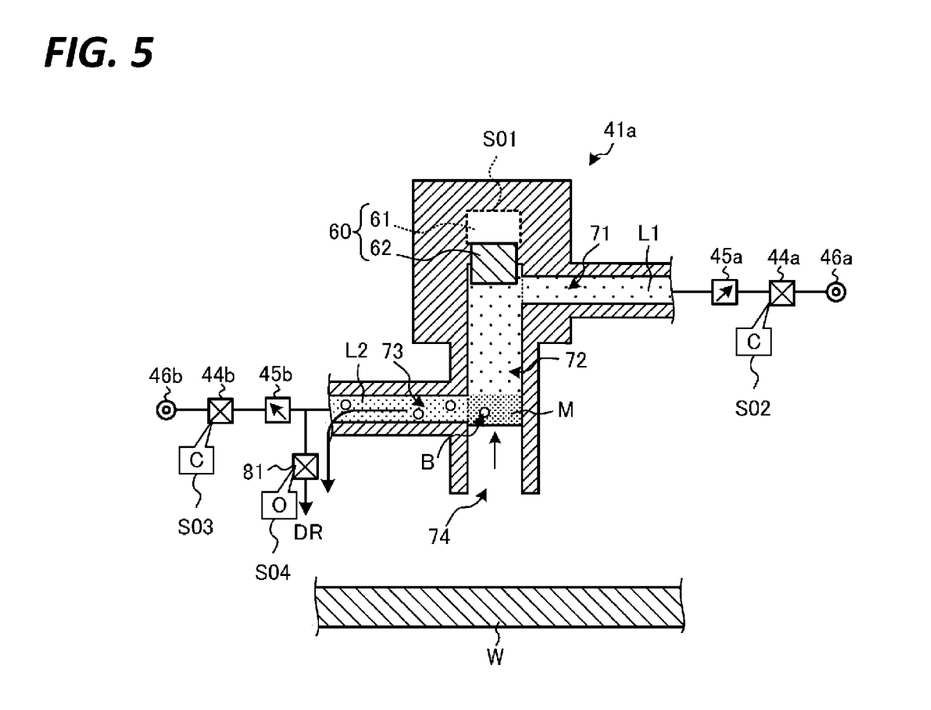
FIG. 5 is a view illustrating a liquid dripping suppression processing of the processing liquid nozzle according to the embodiment.

FIGS. 4 and 5 are views illustrating the liquid dripping suppression processing of the processing liquid nozzle according to the embodiment. Further, FIG. 4 illustrates a case where the cleaning processing of the wafer W is performed by ejecting the mixed liquid M to which the ultrasonic waves S are applied from the nozzle 41a.

When the cleaning processing of the wafer W is performed using the nozzle 41a, both the valve 44a connected to the first supply flow path 71 and the valve 44b connected to the second supply flow path 73 are opened (also indicated as "O" in the following drawings).

Further, in this case, the valve 81 is closed (also indicated as "C" in the following drawings), and the ultrasonic waves S are output from the ultrasonic wave generator 60. Therefore, the mixed liquid M to which the ultrasonic waves S are applied may be ejected from the ejection port 74 of the nozzle 41a.

Then, when the cleaning processing of the wafer W is completed and the ejection of the mixed liquid M is ended, as illustrated in FIG. 5, the controller 18 (see FIG. 1) first stops the output of the ultrasonic wave S by the ultrasonic wave generator 60 (step S01). Next, the controller 18 closes the valve 44a, and stops the supply of the first liquid L1 to the ejection flow path 72 (step S02).

In this manner, by stopping the supply of the first liquid L1 after the output of the ultrasonic wave S is stopped, the ultrasonic wave generator 60 may be suppressed from wasting the ultrasonic waves S. Therefore, according to the embodiment, the ultrasonic wave generator 60 may be suppressed from being damaged by wasting the ultrasonic waves S.

Next, the controller 18 closes the valve 44b, and stops the supply of the second liquid L2 to the ejection flow path 72 (step S03). This step S03 may be performed at the same time as step S02 described above.

Then, the controller 18 opens the valve 81, and discharges the second liquid L2 remaining in the second supply flow path 73 to the drain unit DR (step S04). Therefore, the mixed liquid M remaining in the vicinity of the ejection port 74 may be returned to the upstream side of the ejection flow path 72.

By the processing that has been described, in the embodiment, the mixed liquid M remaining in the vicinity of the ejection port 74 may be suppressed from dripping to the outside.

When the cleaning processing of the wafer W is started again, the ultrasonic waves S may be output from the ultrasonic wave generator 60 after the first liquid L1 is supplied from the first supply flow path 71 to the ejection flow path 72. Therefore, the ultrasonic wave generator 60 may be suppressed from wasting the ultrasonic waves S, and thus, the ultrasonic wave generator 60 may be suppressed from being damaged by wasting the ultrasonic waves S.

Further, in the example in FIGS. 4 and 5, the example in which the second liquid L2 remaining in the second supply flow path 73 is discharged to the drain unit DR due to its own weight by using the valve 81 provided below the second supply flow path 73 is illustrated. However, in the embodiment, the second liquid L2 remaining in the second supply flow path 73 may be forcibly discharged to the drain unit DR.

For example, the second liquid L2 remaining in the second supply flow path 73 may be forcibly discharged to the drain unit DR by adding an aspirator or an ejector between the valve 81 and the second supply flow path 73 and operating the aspirator or the ejector.

Figure 6:
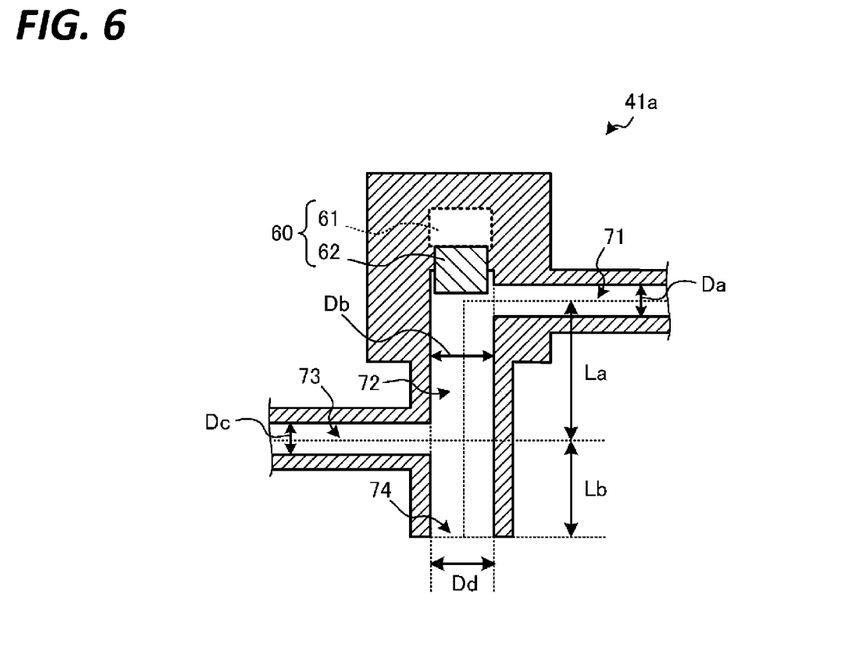
FIG. 6 is a view illustrating the configuration of the processing liquid nozzle according to the embodiment.

Subsequently, an appropriate dimension of each part in the nozzle 41a will be described with reference to FIG. 6. FIG. 6 is a view illustrating the configuration of the processing liquid nozzle according to the embodiment.

In the following description, as illustrated in FIG. 6, an inner diameter of the first supply flow path 71 is Da, an inner diameter of the ejection flow path 72 is Db, an inner diameter of the second supply flow path 73 is Dc, and a diameter of the ejection port 74 is Dd. Further, in the ejection flow path 72, a length from the connection portion with the first supply flow path 71 to the connection portion with the second supply flow path 73 is La, and a length from the connection portion with the second supply flow path 73 to the ejection port 74 is Lb.

In the embodiment, the length La from the connection portion with the first supply flow path 71 to the connection portion with the second supply flow path 73 may be equal to or larger than the diameter Dd of the ejection port 74. Therefore, the bubbles B contained in the second liquid L2 or the mixed liquid M may be suppressed from flowing back to the vicinity of the oscillating body 62.

Therefore, according to the embodiment, the oscillating body 62 may be further suppressed from being damaged inside the nozzle 41a due to the bubbles B. The diameter Dd of the ejection port 74 itself is not particularly limited, and may be appropriately set according to the ejection flow rate of the mixed liquid M required for the cleaning processing of the wafer W.

Further, the inner diameter Da of the first supply flow path 71 or the inner diameter Dc of the second supply flow path 73 are not particularly limited, and may be appropriately set according to the supply flow rate of the first liquid L1 and the second liquid L2 required for the cleaning processing of the wafer W.

For example, when the mixing ratio of the first liquid L1 and the second liquid L2 is 2:1, the ratio of the inner diameter Da and the inner diameter Dc may be set to 2:1, or the inner diameter Da and the inner diameter Dc may be set to the same value.

Further, in the embodiment, the length Lb from the connection portion with the second supply flow path 73 to the ejection port 74 may be equal to or larger than the diameter Dd of the ejection port 74. Therefore, a sufficient length of the flow path may be secured for mixing the first liquid L1 and the second liquid L2.

Further, in the embodiment, when the viscosity of the first liquid L1 is larger than the viscosity of the second liquid L2, the length Lb from the connection portion with the second supply flow path 73 to the ejection port 74 may be longer than the length La from the connection portion with the first supply flow path 71 to the connection portion with the second supply flow path 73.

In this manner, when the second liquid L2 has a low viscosity, it is possible for the mixed liquid M in the vicinity of the ejection port 74 to secure a sufficient surface tension by setting the value of the length Lb to be large. Therefore, according to the embodiment, the mixed liquid M may be suppressed from dripping from the ejection port 74. When the second liquid L2 has a high viscosity, the value of the length Lb may be set to be small.

Further, in the embodiment, when the flow rate of the first liquid L1 is smaller than the flow rate of the second liquid L2, the length La from the connection portion with the first supply flow path 71 to the connection portion with the second supply flow path 73 may be longer than the length Lb from the connection portion with the second supply flow path 73 to the ejection port 74.

In this manner, when the flow rate of the first liquid L1 is smaller than the flow rate of the second liquid L2, the second liquid L2 may be suppressed from flowing back to the first supply flow path 71 by setting the value of the length La to be large.

In this manner, when the flow rate of the first liquid L1 is larger than the flow rate of the second liquid L2, the second liquid L2 is less likely to flow back to the first supply flow path 71.

Further, in the embodiment, the supply pressure of the first liquid L1 may be larger than the supply pressure of the second liquid L2. Therefore, even when the length La from the connection portion with the first supply flow path 71 to the connection portion with the second supply flow path 73 is set to be short, the second liquid L2 may be suppressed from flowing back to the first supply flow path 71.

Further, in the embodiment, when reaction heat is generated when the first liquid L1 and the second liquid L2 are mixed, the length La from the connection portion with the first supply flow path 71 to the connection portion with the second supply flow path 73 may be longer than the length Lb from the connection portion with the second supply flow path 73 to the ejection port 74.

In this manner, when the reaction heat is generated when the first liquid L1 and the second liquid L2 are mixed, the reaction heat generated by the mixed liquid M may be suppressed from being transmitted to the oscillating body 62 by setting the value of the length La to be large.

Therefore, according to the embodiment, the connected surface of the oscillating body 62 and the oscillator 61 may be suppressed from being damaged due to the reaction heat generated by the mixed liquid M.

In the embodiment, the temperature of the first liquid L1 itself that is brought into contact with the oscillating body 62 may be low (e.g., room temperature or lower). Therefore, the connected surface of the oscillating body 62 and the oscillator 61 may be suppressed from being damaged.

Further, in the embodiment, the inner diameter Db of the ejection flow path 72 may be equal to the diameter Dd of the ejection port 74. Therefore, it is possible to minimize the pressure loss of the first liquid L1 or the mixed liquid M flowing through the ejection flow path 72, and thus, the mixed liquid M may be efficiently ejected.

Figure 7:
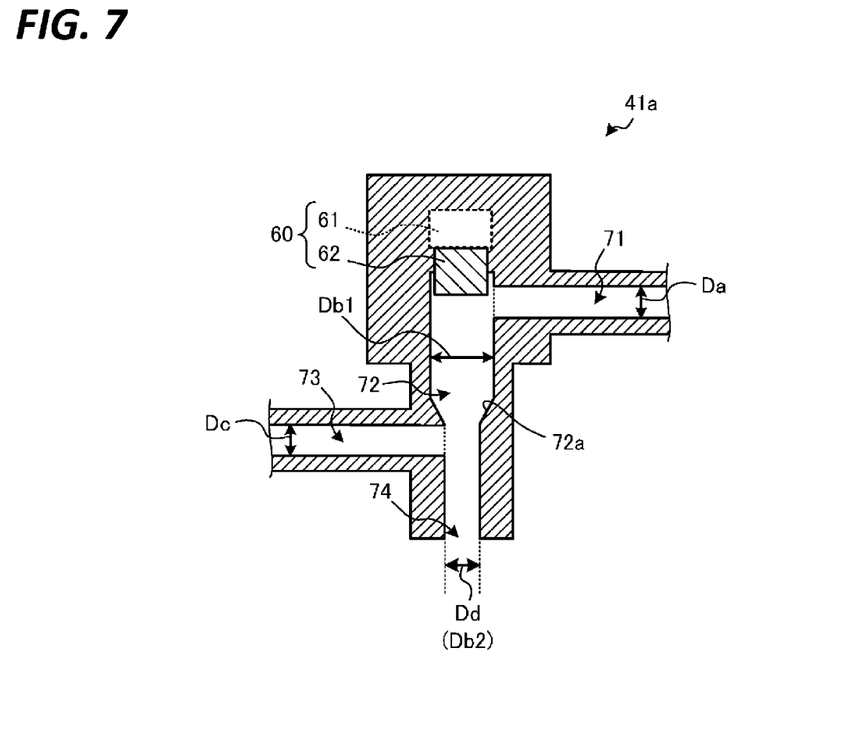
FIG. 7 is a view illustrating a configuration of a processing liquid nozzle according to a modification of the embodiment.

The inner diameter Db of the ejection flow path 72 is not limited to be equal to the diameter Dd of the ejection port 74. FIG. 7 is a view illustrating a configuration of a processing liquid nozzle according to a modification of the embodiment. As illustrated in FIG. 7, in the modification, an inner diameter Db1 of the ejection flow path 72 on the upstream side is larger than the diameter Dd of the ejection port 74. That is, in the modification, the inner diameter Db1 of the ejection flow path 72 on the upstream side is larger than an inner diameter Db2 on the downstream side connected to the ejection port 74.

Therefore, the diameter Dd of the ejection port 74 may be appropriately set according to the ejection flow rate of the mixed liquid M (see FIG. 3) required for the cleaning processing of the wafer W, and the oscillating body 62 having a larger size than the diameter Dd may be provided on the upstream side of the ejection flow path 72.

Therefore, according to the modification, the ultrasonic waves S (see FIG. 3) having a higher output may be applied to the mixed liquid M, and thus, the wafer W may be cleaned with higher cleaning capability.

Further, in the modification, a taper 72a may be provided at a portion of the ejection flow path 72 where the inner diameter is changed from Db to Dc. Therefore, the ultrasonic waves S transmitted from the oscillating body 62 may be suppressed from hitting the inner wall of the ejection flow path 72 and directly bouncing back to the oscillating body 62.

Further, in the embodiment that has been described, the example in which the mixed liquid M is generated by mixing two kinds of liquids is illustrated. However, the mixed liquid M may be generated by mixing three or more kinds of liquids. For example, the mixed liquid M may be generated by using ammonia as the first liquid L1, hydrogen peroxide solution as the second liquid L2, and DIW as a third liquid.

Then, when the mixed liquid M is generated by further mixing the third liquid, a third supply flow path that supplies the third liquid may be connected to the first supply flow path 71, or to the ejection flow path 72 on the upstream side from the connection portion with the second supply flow path 73.

Further, in the example in FIG. 3, the example in which the mixed liquid M is ejected to the wafer W with the ejection flow path 62 directed substantially vertically is illustrated. However, the mixed liquid may be ejected to the wafer W with the ejection flow path 62 directed diagonally. Therefore, the mixed liquid M bounced back from the wafer W may be suppressed from adhering to the nozzle 41 and contaminating the nozzle 41a.

Further, in this case, the controller 18 may control the position of the nozzle 41a so that the mixed liquid M is ejected in the direction facing the rotation direction of the wafer W in the first half portion of the cleaning processing of the wafer W, and the mixed liquid M is ejected in the direction along the rotation direction of the wafer W in the latter half portion of the cleaning processing.

Therefore, in the first half portion of the cleaning processing, the residence time of the ultrasonic wave S on the wafer W may further extend, and thus, the film having high chemical stability may be efficiently removed. Further, in the latter half portion of the cleaning processing, the residence time of the ultrasonic wave S on the wafer W may be short, and thus, the surface of the wafer W from which the film is peeled may be suppressed from being damaged.

[Detail of Liquid Dripping Suppress Mechanism]

Figure 8:
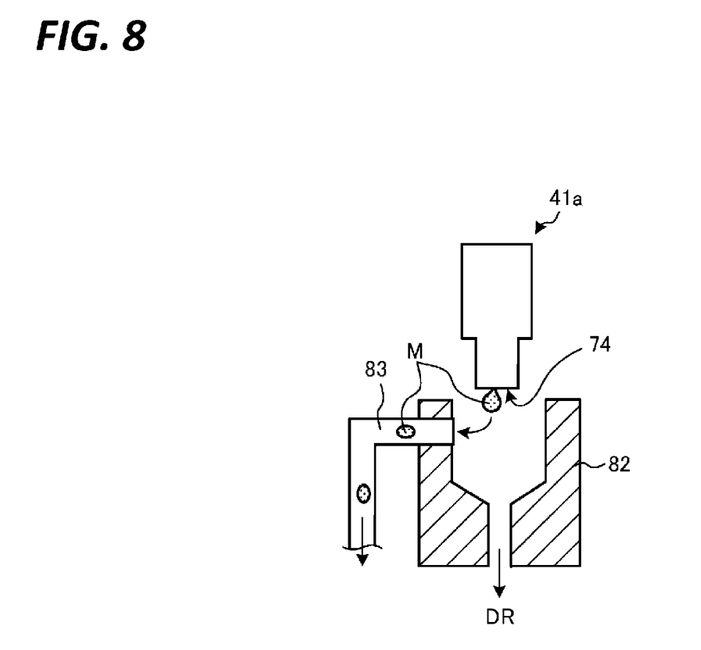
FIG. 8 is a view illustrating a configuration of a dummy dispense bath according to the embodiment.

Subsequently, details of a liquid dripping suppress mechanism according to the embodiment will be described with reference to FIGS. 8 to 10. FIG. 8 is a view illustrating a configuration of a dummy dispense bath 82 according to the embodiment. The dummy dispense bath 82 described in the following is an example of the liquid dripping suppress mechanism.

The dummy dispense bath 82 is provided inside the chamber 20 (FIG. 2) of the processing unit 16 (see FIG. 2), and is disposed below the standby position of the nozzle 41a. During the dummy dispense processing for the purpose of eliminating air bubbles or foreign substances in each flow path connected to the nozzle 41a, the dummy dispense bath 82 receives the mixed liquid M ejected from the nozzle 41a, and discharge the received mixed liquid M to the drain unit DR.

Further, in addition to the function of receiving the mixed liquid M ejected from the nozzle 41a, the dummy dispense bath 82 according to the embodiment is provided with a suction nozzle 83 that sucks the droplets of the mixed liquid M adhering to the ejection port 74 of the nozzle 41a.

Then, the suction nozzle 83 is operated to suck the droplets of the mixed liquid M adhering to the ejection port 74 of the nozzle 41a, and thus, the mixed liquid M may be suppressed from dripping from the ejection port 74.

Further, before the wafer W is cleaned by the substrate processing unit 30, the controller 18 may use the suction nozzle 83 to suck the mixed liquid M adhering to the ejection port 74 of the nozzle 41a waiting in the dummy dispense bath 82.

Therefore, when the nozzle 41a is moved above the wafer W before the cleaning processing, the mixed liquid M may be suppressed from mistakenly dripping onto the wafer W.

In the example in FIG. 8, the example in which the suction nozzle 83 is provided in the dummy dispense bath 82 is illustrated. However, the location in which the suction nozzle 83 is provided is not limited to the dummy dispense bath 82. FIG. 9 is a view illustrating a configuration of a processing liquid nozzle according to another modification of the embodiment.

Figure 9:
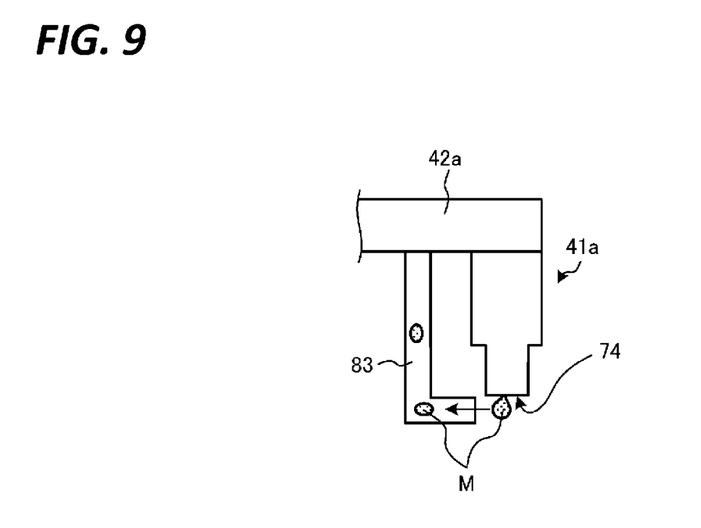
FIG. 9 is a view illustrating a configuration of a processing liquid nozzle according to another modification of the embodiment.

As illustrated in FIG. 9, the above-described suction nozzle 83 may be provided on the arm 42a so that the suction port is provided in the vicinity of the ejection port 74 of the nozzle 41a. Therefore, even in a state where the nozzle 41a is not waiting at the standby position, the mixed liquid M may be suppressed from dripping from the ejection port 74.

For example, in an example in FIG. 9, the suction nozzle 83 may be operated when the cleaning processing is completed and the nozzle 41a is returned to the standby position so as to suck the droplets of the mixed liquid M adhering to the ejection port 74 of the nozzle 41a.

Figure 10:
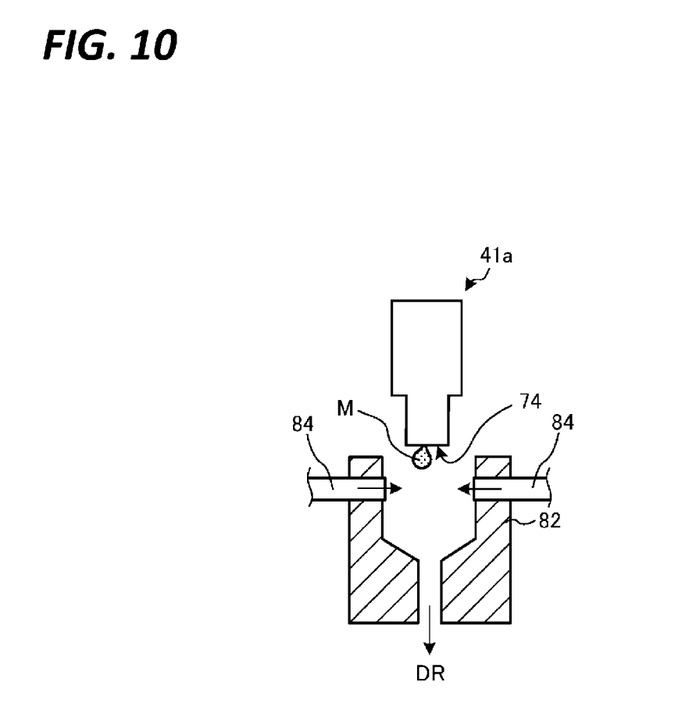
FIG. 10 is a view illustrating a configuration of a dummy dispense bath according to a modification of the embodiment.

FIG. 10 is a view illustrating a configuration of the dummy dispense bath 82 according to a modification of the embodiment. As illustrated in FIG. 10, in addition to the function of receiving the mixed liquid M ejected from the nozzle 41a, the dummy dispense bath 82 according to the modification is provided with an air blower 84 that air-blows the droplets of the mixed liquid M adhering to the ejection port 74 of the nozzle 41a.

Then, the air blower 84 is operated to air-blow the droplets of the mixed liquid M adhering to the ejection port 74 of the nozzle 41a, and thus, the mixed liquid M may be suppressed from dripping from the ejection port 74.

Further, before the wafer W is cleaned by the substrate processing unit 30, the controller 18 may use the air blower 84 to air-blow the mixed liquid M adhering to the ejection port 74 of the nozzle 41a waiting in the dummy dispense bath 82.

Therefore, when the nozzle 41a is moved above the wafer W before the cleaning processing, the mixed liquid M may be suppressed from mistakenly dripping onto the wafer W. The droplets of the mixed liquid M air-blown by the air blower 84 are received by the dummy dispense bath 82 and are discharged to the drain unit DR.

The processing liquid nozzle (nozzle 41a) according to the embodiment is provided with the ultrasonic wave generator 60, the first supply flow path 71, the ejection flow path 72, and the second supply flow path 73. The ultrasonic wave generator 60 includes the oscillator 61 that generates the ultrasonic waves S and the oscillating body 62 connected to the oscillator 61. The first supply flow path 71 supplies the first liquid L1 to the position that is in contact with the oscillating body 62 of the ultrasonic wave generator 60. The ejection flow path 72 supplies the first liquid L1 to which the ultrasonic waves S are applied by the ultrasonic wave generator 60 to the ejection port 74. The second supply flow path 73 is connected to the ejection flow path 72 on the downstream side from the ultrasonic wave generator 60, and supplies the second liquid L2 to the ejection flow path 72. Therefore, the oscillating body 62 may be suppressed from being damaged inside the nozzle 41a due to the ultrasonic waves S applied to the mixed liquid M and the bubbles B contained in the mixed liquid M.

Further, in the processing liquid nozzle (nozzle 41a) according to the embodiment, the first liquid L1 has a strong acidity or a strong alkalinity, and the second liquid L2 has an effervescent property. Therefore, even when a film having a high chemical stability such as a sacrificial film is formed on the wafer W, the film having a high chemical stability may be removed with high cleaning capability.

Further, in the processing liquid nozzle (nozzle 41a) according to the embodiment, in the ejection flow path 72, the length La from the connection portion with the first supply flow path 71 to the connection portion with the second supply flow path 73 is equal to or larger than the diameter Dd of the ejection port 74. Therefore, the oscillating body 62 may be further suppressed from being damaged inside the nozzle 41a due to the bubbles B.

Further, in the processing liquid nozzle (nozzle 41a) according to the embodiment, in the ejection flow path 72, the length Lb from the connection portion with the second supply flow path 73 to the ejection port 74 is equal to or larger than the diameter Dd of the ejection port 74. Therefore, a sufficient length of the flow path may be secured for mixing the first liquid L1 and the second liquid L2.

Further, in the processing liquid nozzle (nozzle 41a) according to the embodiment, the inner diameter Db of the ejection flow path 72 is equal to the diameter Dd of the ejection port 74. Therefore, it is possible to minimize the pressure loss of the first liquid L1 or the mixed liquid M flowing through the ejection flow path 72, and thus, the mixed liquid M may be efficiently ejected.

Further, in the processing liquid nozzle (nozzle 41a) according to the embodiment, the inner diameter Db1 of the ejection flow path 72 on the upstream side is larger than the diameter Dd of the ejection port 74. Therefore, since the ultrasonic waves S having a higher output may be applied to the mixed liquid M, the wafer W may be cleaned with higher cleaning capability.

Further, in the processing liquid nozzle (nozzle 41a) according to the embodiment, when the viscosity of the first liquid L1 is larger than the viscosity of the second liquid L2, the length Lb is longer than the length La. The length Lb is the length from the connection portion with the second supply flow path 73 to the ejection port 74 in the ejection flow path 72, and the length La is the length from the connection portion with the first supply flow path 71 to the connection portion with the second supply flow path 73 in the ejection flow path 72. Therefore, the mixed liquid M may be suppressed from dripping from the ejection port 74.

Further, in the processing liquid nozzle (nozzle 41a) according to the embodiment, when the flow rate of the first liquid L1 is smaller than the flow rate of the second liquid L2, the length La is longer than the length Lb. Therefore, the second liquid L2 may be suppressed from flowing back to the first supply flow path 71.

Further, in the processing liquid nozzle (nozzle 41a) according to the embodiment, the supply pressure of the first liquid L1 is larger than the supply pressure of the second liquid L2. Therefore, even when the length La from the connection portion with the first supply flow path 71 to the connection portion with the second supply flow path 73 is set to be short, the second liquid L2 may be suppressed from flowing back to the first supply flow path 71.

Further, in the processing liquid nozzle (nozzle 41a) according to the embodiment, when the reaction heat is generated when the first liquid L1 and the second liquid L2 are mixed, the length La is longer than the length Lb. Therefore, the connected surface of the oscillating body 62 and the oscillator 61 may be suppressed from being damaged due to the reaction heat generated from the mixed liquid M.

Further, the processing liquid nozzle (nozzle 41a) according to the embodiment is further provided with the third supply flow path that is connected to the first supply flow path 71, or to the ejection flow path 72 on the upstream side from the connection portion with the second supply flow path 73, and supplies the third liquid. Therefore, the cleaning processing may be performed with the mixed liquid M in which three kinds of liquids are mixed.

Further, the processing liquid nozzle (nozzle 41a) according to the embodiment is further provided with the static elimination unit configured to statically eliminate the mixed liquid M ejected from the ejection port 74. Therefore, when charging or arcing of the wafer W becomes a problem, the charging or arcing of the wafer W may be suppressed form occurring when the cleaning processing using the mixed liquid M is performed.

The cleaning apparatus (substrate processing system 1) according to the embodiment is provided with the above-described processing liquid nozzle (nozzle 41a), and the substrate processing unit 30 that holds and rotates the substrate (waver W). Therefore, it is possible to realize a cleaning apparatus in which damage to the oscillating body 62 is suppressed inside the nozzle 41a.

Further, the cleaning apparatus (substrate processing system 1) according to the embodiment is further provided with the dummy dispense bath 82 provided at the standby position of the processing liquid nozzle (nozzle 41a). Then, the dummy dispense bath 82 includes the suction nozzle 83 that sucks the liquid (mixed liquid M) adhering to the ejection port 74. Therefore, the mixed liquid M may be suppressed from dripping from the ejection port 74.

Further, the cleaning apparatus (substrate processing system 1) according to the embodiment is further provided with the controller 18 that controls each part. Then, before the substrate (wafer W) is processed by the substrate processing unit 30, the controller 18 uses the suction nozzle 83 to suck the liquid (mixed liquid M) adhering to the ejection port 74 of the processing liquid nozzle (nozzle 41a) waiting in the dummy dispense bath 82. Therefore, when the nozzle 41a is moved above the wafer W before the cleaning processing, the mixed liquid M may be suppressed from mistakenly dripping onto the wafer W.

Further, the cleaning apparatus (substrate processing system 1) according to the embodiment is further provided with the dummy dispense bath 82 provided at the standby position of the processing liquid nozzle (nozzle 41a). Then, the dummy dispense bath 82 includes the air blower 84 that air-blows the liquid (mixed liquid M) adhering to the ejection port 74. Therefore, the mixed liquid M may be suppressed from dripping from the ejection port 74.

Further, the cleaning apparatus (substrate processing system 1) according to the embodiment is further provided with the controller 18 that controls each part. Then, before the substrate (wafer W) is processed by the substrate processing unit 30, the controller 18 uses the air blower 84 to air-blow the liquid (mixed liquid M) adhering to the ejection port 74 of the processing liquid nozzle (nozzle 41a) waiting in the dummy dispense bath 82. Therefore, when the nozzle 41a is moved above the wafer W before the cleaning processing, the mixed liquid M may be suppressed from mistakenly dripping onto the wafer W.

In the above, although the embodiment of the present disclosure has been described, the present disclosure is not limited to the above embodiment, and various modifications may be made without departing from the gist of the present disclosure. For example, in the above embodiment, the example in which the nozzle 41a is applied for the cleaning processing of the wafer W is described. However, the processing in which the nozzle 41a is applied is not limited to the cleaning processing of the wafer W, but the nozzle 41a may be applied to various liquid processings.

It should be considered that the embodiments disclosed in here are exemplary and not restrictive in all aspects. In practice, the embodiments described above may be implemented in various forms. Further, the above embodiments may be omitted, replaced, or changed in various forms without departing from the scope of accompanying claims and the gist thereof.

DESCRIPTION OF SYMBOLS

W: wafer
1: substrate processing system (an example of a cleaning apparatus)
16: processing unit
18: controller
30: substrate processing unit
41a: nozzle (an example of a processing liquid nozzle)
60: ultrasonic wave generator
61: oscillator
62: oscillating body
71: first supply flow path
72: ejection flow path
73: second supply flow path
74: ejection port
82: dummy dispense bath
83: suction nozzle
84: air blower
Da, Db, Dc: inner diameter
Dd: diameter
L1: first liquid
L2: second liquid
La, Lb: length

What is claimed is:
1. A processing liquid nozzle comprising:
an ultrasonic wave generator including an oscillator that generates ultrasonic waves and an oscillating body that is connected to the oscillator;
a first supply flow path configured to supply a first liquid to a point contacting the oscillating body of the ultrasonic wave generator;

an ejection flow path configured to supply the first liquid to which the ultrasonic waves are applied by the ultrasonic wave generator to an ejection port; and a second supply flow path connected to the ejection flow path on a downstream side from the ultrasonic wave generator and configured to supply a second liquid to the ejection flow path, wherein the oscillating body is provided at an upstream end of the ejection flow path and extends into the ejection flow path such that the first supply flow path directly supplies the first liquid to the point contacting the oscillating body upon exiting the first supply flow path.

2. The processing liquid nozzle according to claim 1, wherein the first liquid has a strong acidity or a relatively strong alkalinity, and the second liquid has an effervescent property.

3. The processing liquid nozzle according to claim 1, wherein, in the ejection flow path, a length from a connection portion between the ejection flow path and the first supply flow path to a connection portion between the ejection flow path and the second supply flow path is equal to or larger than a diameter of the ejection port.

4. The processing liquid nozzle according to claim 1, wherein, in the ejection flow path, a length from a connection portion between the ejection flow path and the second supply flow path to the ejection port is equal to or larger than the diameter of the ejection port.

5. The processing liquid nozzle according to claim 1, wherein an inner diameter of the ejection flow path is equal to the diameter of the ejection port.

6. The processing liquid nozzle according to claim 1, wherein an inner diameter of an upstream side of the ejection flow path is larger than the diameter of the ejection port.

7. The processing liquid nozzle according to claim 1, wherein, when viscosity of the first liquid is larger than viscosity of the second liquid, in the ejection flow path, a length from a connection portion between the ejection flow path and the second supply flow path to the ejection port is longer than a length from a connection portion between the ejection flow path and the first supply flow path to the connection portion between the ejection flow path and the second supply flow path.

8. The processing liquid nozzle according to claim 1, wherein, when a flow rate of the first liquid is larger than a flow rate of the second liquid, in the ejection flow path, a length from a connection portion between the ejection flow path and the first supply flow path to a connection portion between the ejection flow path and the second supply flow path is longer than a length from the connection portion between the ejection flow path and the second supply flow path to the ejection port.

9. The processing liquid nozzle according to claim 1, wherein a supply pressure of the first liquid is larger than a supply pressure of the second liquid.

10. The processing liquid nozzle according to claim 1, wherein, when reaction heat is generated when the first liquid and the second liquid are mixed, in the ejection flow path, a length from a connection portion between the ejection flow path and the first supply flow path to a connection portion between the ejection flow path and the second supply flow path is longer than a length from the connection portion between the ejection flow path and the second supply flow path to the ejection port.

11. The processing liquid nozzle according to claim 1, further comprising:

a third supply flow path connected to the first supply flow path or an upstream side of the connection portion between the ejection flow path and the second supply flow path, and configured to supply a third liquid.

12. The processing liquid nozzle according to claim 1, further comprising:

a destaticizer configured to destaticize a mixed liquid ejected from the ejection port.

13. A cleaning apparatus comprising:

the processing liquid nozzle according to claim 1; and a substrate processing unit including a substrate holder that holds a substrate and a column that rotates the substrate holder.

14. The cleaning apparatus according to claim 13, further comprising:

a dummy dispense bath provided at a standby position of the processing liquid nozzle, wherein the dummy dispense bath includes a suction nozzle that sucks a liquid adhering to the ejection port.

15. The cleaning apparatus according to claim 14, further comprising:

a controller configured to control each part of the cleaning apparatus, wherein, before processing the substrate by the substrate processing unit, the controller causes the suction nozzle to suck the liquid adhering to the ejection port of the processing liquid nozzle standing by in the dummy dispense bath.

16. The cleaning apparatus according to claim 13, further comprising:

a dummy dispense bath provided at a standby position of the processing liquid nozzle, wherein the dummy dispense bath includes an air blower that air-blows the liquid adhering to the ejection port.

17. The cleaning apparatus according to claim 16, further comprising:

a controller that controls each part of the cleaning apparatus, wherein, before the substrate is processed by the substrate processing unit, the controller causes the air blower to air-blow the liquid adhering to the ejection port of the processing liquid nozzle standing by in the dummy dispense bath.

* * * * *